(12) United States Patent
Jiang et al.

(10) Patent No.: US 9,252,010 B2
(45) Date of Patent: Feb. 2, 2016

(54) METHOD FOR PROCESSING STRUCTURE IN MANUFACTURING SEMICONDUCTOR DEVICE

(71) Applicant: Semiconductor Manufacturing International (Shanghai) Corporation, Shanghai (CN)

(72) Inventors: Lily Jiang, Shanghai (CN); Cindy Li, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 95 days.

(21) Appl. No.: 14/180,227

(22) Filed: Feb. 13, 2014

(65) Prior Publication Data

US 2015/0132954 A1     May 14, 2015

(30) Foreign Application Priority Data

Nov. 13, 2013  (CN) .......................... 2013 1 0562536

(51) Int. Cl.
*H01L 21/302*   (2006.01)
*H01L 21/461*   (2006.01)
*H01L 21/02*    (2006.01)

(52) U.S. Cl.
CPC ................ *H01L 21/02065* (2013.01)

(58) Field of Classification Search
CPC ................................... H01L 21/02065
USPC ............................. 216/95; 438/692
See application file for complete search history.

(56) References Cited

U.S. PATENT DOCUMENTS

| 7,732,874 | B2 | 6/2010 | Zhu et al. |
| 7,859,044 | B2 | 12/2010 | Wong et al. |
| 2004/0244823 | A1* | 12/2004 | Kim et al. ........... 134/28 |

* cited by examiner

*Primary Examiner* — Roberts Culbert
(74) *Attorney, Agent, or Firm* — Innovation Counsel LLP

(57) ABSTRACT

A method used for processing a structure in manufacturing of a semiconductor device may include polishing the structure to form a polished structure. The polished structure may include a metal member, a dielectric layer that contacts the metal member, and a particle that contacts at least one of the metal member and the dielectric layer. The method may further include applying an organic acid to the polished structure to remove at least a portion of the particle. The particle may be substantially removed, such that satisfactory quality of the semiconductor may be provided.

18 Claims, 3 Drawing Sheets

METHOD FOR PROCESSING STRUCTURE IN MANUFACTURING SEMICONDUCTOR DEVICE

CROSS-REFERENCE TO RELATED APPLICATION

This application claims priority to and benefit of Chinese Patent Application No. 201310562536.8, filed on Nov. 13, 2013, the Chinese Patent Application being incorporated herein by reference in its entirety.

BACKGROUND OF THE INVENTION

The present invention is related to a method for processing a structure (e.g., a semiconductor structure) in manufacturing of a semiconductor device.

A semiconductor device may include a metal gate electrode, such as an aluminum (Al) gate electrode or a tungsten (W) gate electrode. A polishing process, such as a chemical mechanical polishing (CMP) process, may be performed for forming the metal gate electrode. As a result of the polishing process, unwanted particles may be trapped on the semiconductor device.

SUMMARY

An embodiment of the present invention may be related to a method for processing a structure in manufacturing of a semiconductor device. The method may include polishing (e.g., through chemical mechanical polishing) the structure to form a polished structure. The polished structure may include a first metal member, a dielectric layer that contacts the first metal member, and a particle that contacts at least one of the first metal member and the dielectric layer. The particle might potentially cause defect of the semiconductor device. The method may further include applying a first organic acid to the polished structure to remove at least a first portion of the particle. The method may enable substantial removal of the particle. Advantageously, satisfactory quality of the semiconductor device may be provided.

The first metal member may be a gate electrode of a transistor that may include or be formed of one or more of tungsten (W), copper (Cu), aluminum (Al), ruthenium (Ru), platinum (Pt), and an alloy of some of these materials.

The dielectric layer may include at least one of a $SiO_2$ layer and a SiN layer.

The polished structure may include a second metal member. The dielectric layer may contact the particle and may be positioned between the first metal member and the second metal member.

A protrusion of the first metal member may protrude over the dielectric layer. A protrusion of the second metal member may protrude over the dielectric layer. The particle may be located between the protrusion of the first metal member and the protrusion of the second metal member.

The method may include using the first organic acid to cause at least one of first electrostatic repulsion between the particle and the dielectric layer, second electrostatic repulsion between the particle and the first metal member, and third electrostatic repulsion between the particle and the second metal member.

The method may include using the first organic acid to cause the particle to have a first negative Zeta potential value. The method may further include using the first organic acid to cause at least one of the first metal member and the second metal member to have a second negative Zeta potential value.

The method may include using the first organic acid to cause the dielectric layer to have a third negative Zeta potential value.

The method may include using the first organic acid to cause electrostatic repulsion between the particle and the first metal member.

A pH value of the first organic acid may be in a range of 5 to 7.

A pH value of the first organic acid may be in a range of 5.5 to 6.5.

The first organic acid may include at least one of oxalic acid, malonic acid, succinic acid, maleic acid, phthalic acid, and an amino acid.

A weight percent (or mass percentage) of the second organic acid may be in a range of 0.01 wt % to 10 wt %.

The first organic acid may be applied in a chemical cleaning process to substantially remove the particle. The chemical cleaning process may not involve using any contact pad to contact the polished structure.

The method may include using a second organic acid to remove a second portion of the particle. The first organic acid is applied in a solution polishing process to remove the first portion of the particle. The solution polishing process may involve using a polishing pad that contacts the polished structure. The second organic acid may be used in a chemical cleaning process to remove the second portion of the particle. The chemical cleaning process may not involve using any contact pad to contact an intermediate process resulted from the solution polishing process. The chemical cleaning process may be performed after the solution polishing process.

A pH value of the second organic acid is may be a range of 5 to 7 and may be in a range of 5.5 to 6.5.

The second organic acid may include at least one of oxalic acid, malonic acid, succinic acid, maleic acid, phthalic acid, and an amino acid.

A weight percent (or mass percentage) of the second organic acid may be in a range of 0.01 wt % to 10 wt %.

An embodiment of the invention may be related to a method for manufacturing a semiconductor device. The method may include forming a structure that includes a semiconductor member. The method may further include polishing the structure to form a polished structure. The polished structure may include the semiconductor member, a metal member, a dielectric layer that contacts the metal member, and a particle that contacts at least one of the metal member and the dielectric layer. The particle might potentially cause defect of the semiconductor device. The method may further include applying a first organic acid to the polished structure to remove at least a first portion of the particle, wherein the first organic acid may cause first electrostatic repulsion between the particle and at least one of the metal member and the dielectric layer.

The method may further include using a second organic acid to remove a second portion of the particle, wherein the second organic acid may cause second electrostatic repulsion between the second portion of the particle and at least one of the metal member and the dielectric layer.

The method may enable substantial removal of the particle. Advantageously, satisfactory quality of the semiconductor device and/or a satisfactory manufacturing yield may be provided.

The above summary is related to one or more of many embodiments of the invention disclosed herein and is not intended to limit the scope of the invention.

DETAILED DESCRIPTION

Example embodiments of the present invention are described with reference to the accompanying drawings. In the following description, numerous specific details are set forth in order to provide thorough understanding of the present invention. Embodiments of the present invention may be practiced without some or all of these specific details. Well known process steps and/or structures may not have been described in detail in order to not unnecessarily obscure the present invention.

Various embodiments, including methods and techniques, are described in this disclosure. It should be kept in mind that the invention might also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Figure 1A:
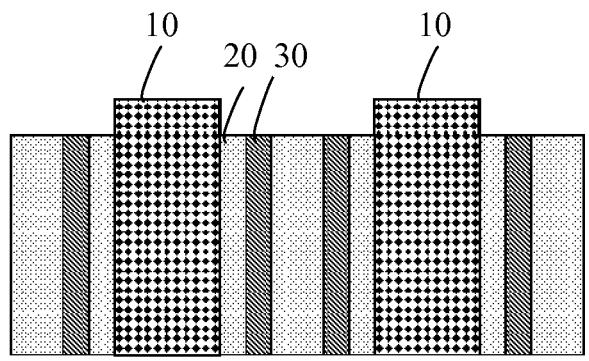
FIG. 1A shows a schematic cross-sectional view illustrating a structure formed during manufacturing of a semiconductor device in accordance with an embodiment of the present invention.
Figure 1B:
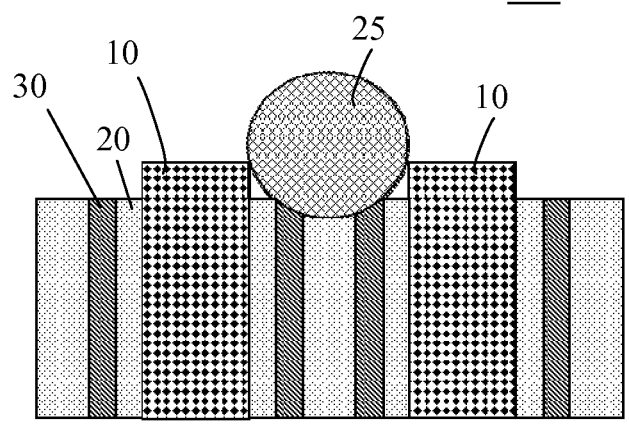
FIG. 1B shows a schematic cross-sectional view illustrating a structure including an unwanted particle and formed during manufacturing of a semiconductor device in accordance with an embodiment of the present invention.

FIG. 1A shows a schematic cross-sectional view illustrating a structure 102 (e.g., a semiconductor structure) formed during manufacturing of a semiconductor device in accordance with an embodiment of the present invention. FIG. 1B shows a schematic cross-sectional view illustrating a structure 100 (e.g., a semiconductor structure) that includes an unwanted particle 25 (trapped on the structure 100 or a related structure) and is formed during manufacturing of the semiconductor device in accordance with an embodiment of the present invention.

Referring to FIG. 1A and FIG. 1B, as one of ordinary skill in the art can readily appreciate, in manufacturing the semiconductor device, after one or more material removal processes (e.g., a CMP process) have been performed, the structure 100 may be formed. The structure 100 may include metal members and one or more dielectric layers. The metal members may be gate electrodes 10 (e.g., tungsten gate electrodes) of one or more transistors. The one or more dielectric layers may include a dielectric layer 20 (e.g., a $SiO_2$ layer) and/or a dielectric layer 30 (e.g., a SiN layer). The structure 100 may further include one or more semiconductor elements/modules disposed under, overlapping, and/or electrically connected to one or more of the metal gate electrodes 10. The one or more semiconductor elements/modules may include one or more of a silicon (Si) substrate, a silicon-on-insulator (SOI) substrate, a gate insulation film, a source element, and a drain member.

A dielectric layer 20 and/or a dielectric layer 30 may be disposed between metal gate electrodes 10, for electrically insulating the metal gate electrodes 10. As a result of partial removal of dielectric material(s), e.g., by a thickness in a range of 50 Å to 100 Å, for ensuring electrical insulation, metal gate electrodes 10 may protrude over (or beyond) the dielectric layer(s) 20 and/or the dielectric layer(s) 30 disposed between the metal gate electrodes 10. For example, a height of a protrusion of a metal gate electrode 10 may be in a range of 50 Å to 100 Å.

Referring to FIG. 1B, the particle 25 may be trapped between protrusions of metal gate electrodes 10 and trapped on surfaces of one or more dielectric layers disposed between the metal gate electrodes 10. The particle 25 may contact and/or may be electrically connected to one or more (e.g., at least two) metal gate electrodes 10. The particle 25 may represent a particle of, for example, a residual of a polishing slurry, a byproduct of a polishing pad, or a byproduct of a removed material resulted from the prior polishing process. The particle 25 may cause unwanted electrical bridging or connection between the metal gate electrodes 10. If the particle 25 were not substantially removed, the performance of the semiconductor device and/or the yield of the manufacturing process might be unacceptable.

For effective and/or substantial removal of the particle 25 from the structure 100 to form the more desirable structure 102, an embodiment of the invention may involve using a chemical cleaning agent with a suitable pH value (e.g., acidity) to generate electrostatic repulsion between the (semiconductor) structure 100 and the particle 25. In an embodiment, subsequent to a gate electrode polishing process and prior to a (semiconductor) structure cleaning process, a solution polishing process may be performed. The solution used in the solution polishing process may have a suitable pH value for generating electrostatic repulsion between the semiconductor structure and the particle 25, in order to at least partially remove the particle 25.

Figure 2:
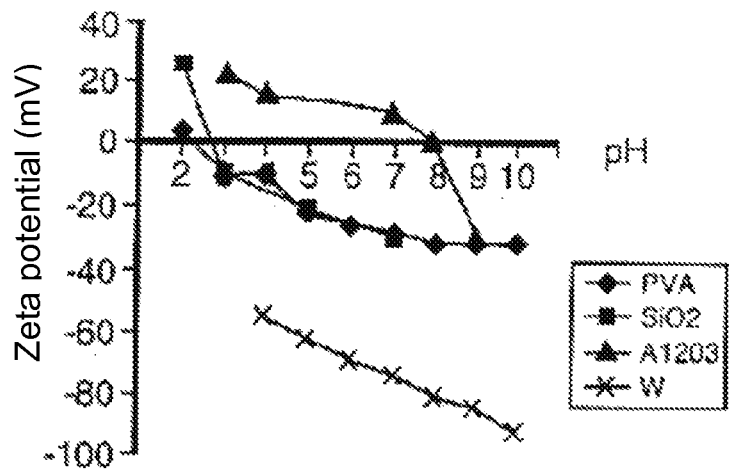
FIG. 2 shows a schematic diagram illustrating relations between Zeta potential values and pH values associated with several materials that may be involved in processing of a structure in manufacturing of a semiconductor device in accordance with an embodiment of the present invention.

FIG. 2 shows a schematic diagram illustrating relations between Zeta potential values and pH values associated with several materials that may be involved in processing of a structure (e.g., the structure 100, the structure 102, and/or an intermediate structure) in manufacturing of a semiconductor device in accordance with an embodiment of the present invention. As known in the art, an isoelectric point (IEP) is the pH value at which the Zeta potential value at a molecule or surface is substantially 0 (zero). At an IEP, the potential of a material is equal to the potential of ions with opposite charges in a solution that contacts the material, such that the potential at the material-solution interface is substantially 0. Referring to FIG. 2, for $SiO_2$, which may be used for forming a dielectric layer and/or for forming abrasive particles in a polishing slurry, the IEP may be about 2.7. For $Al_2O_3$, which may be used for forming abrasive particles in a slurry, the IEP may be about 8.0. For polyvinyl acetate (PVA), which may be used for forming a polishing pad, the IEP may be about 2.0. Tungsten (W), which may be used for forming metal gate electrodes, the IEP may be negative.

Table 1 illustrates IEP values of several materials that may be involved in processing of a structure in manufacturing of a semiconductor device in accordance with an embodiment of the present invention:

TABLE 1

| Material | $WO_3$ | $SiO_2$ | $TiO_2$ | SiN | $ZrO_2$ | $CeO_2$ | $Al_2O_3$ | $Al(OH)_3$ | CuO | polysilicon |
|---|---|---|---|---|---|---|---|---|---|---|
| IEP | 0.5 | 2.7 | 4.7 | 5.0 | 6.7 | 6.8 | 8.0 | 9.25 | 9.5 | 9.8 |

In general, for one of these materials, as a pH value becomes further greater than the IEP, the Zeta potential may become more negative.

Figure 3:
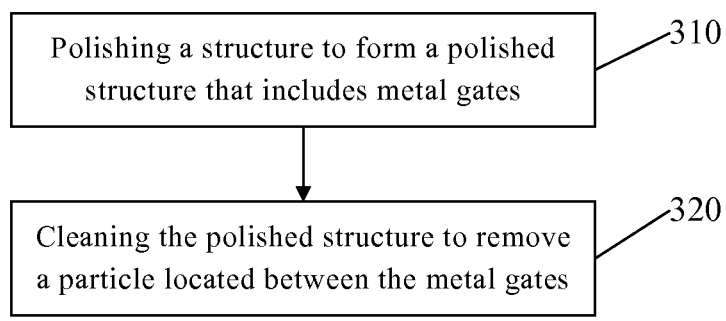
FIG. 3 shows a flowchart illustrating a method for processing a structure in manufacturing of a semiconductor device in accordance an embodiment of the present invention.

FIG. 3 shows a flowchart illustrating a method 300 for processing a structure (e.g., a semiconductor structure) in manufacturing of a semiconductor device in accordance an embodiment of the present invention. The method 300 may include a step 310, polishing a surface of the structure to produce a polished structure, such as the structure 100. The polished structure 100 may include metal gate electrodes 10, dielectric layer(s) 20, and dielectric layer(s) 30.

One or more processing steps may be performed prior to the step 310. For example, prior to the step 310, the dielectric layer 20 and the dielectric layer 30 may be planarized. Sacrificial gates (e.g., polysilicon sacrificial gates) may be exposed, etched, and removed, resulting in trenches. Metal material used for forming metal gate electrodes 10 may be deposited in the trenches prior to the step 310. As a result of the step 310, portions of metal gate electrodes 10 may protrude over one or more dielectric layers positioned between the metal gate electrodes 10, and an unwanted particle 25 may be positioned between protrusions of the metal gate electrodes 10 and may be positioned on the one or more dielectric layers.

The method 300 may further include a step 320, performed after the step 310, substantially cleaning the polished structure for at least partially removing the unwanted particle 25. An organic acid may be used in performing the cleaning The cleaning may be a chemical cleaning process that does not involve any pad that may contact the polished structure.

The method 300 may include selecting a suitable organic acid and/or determining the pH value of the organic acid, such that the organic acid may cause electrostatic repulsion between the surface of the polished structure 100 and the particle 25, for facilitating removal of the particle 25 from the polished structure 100. The method 300 may include select the organic acid such that the organic acid may not substantially or undesirably erode the structure 100 and/or the metal gate electrode 10. The organic acid may be weakly acidic and may cause micro-chemical reactions. The pH value of the organic acid may be in a range of 5 to 7 and may be in a range of 5.5 to 6.5. The weight percent (or mass percentage) of the organic acid may be in a range of 0.01 wt % to 10 wt %. The organic acid may include at least one of oxalic acid, malonic acid, succinic acid, maleic acid, phthalic acid, and an amino acid.

Referring to FIG. 2 and Table 1, in the pH value range 5 to 7, the Zeta potential values of tungsten (W) (an example material of the metal gate electrodes 10), $SiO_2$ (an example material of a slurry residual, a polishing pad byproduct, and/or the dielectric layer 20), SiN (an example material of the dielectric layer 30), and $WO_3$ (an example material of a byproduct of the step 310) may all have negative polarities. Therefore, electrostatic repulsion may be generated between the particle 25 and the metal gate electrodes 10 and/or between the particle 25 and the dielectric layer(s) neighboring and/or between the metal gate electrodes 10.

As a result of the step 320, the particle 25 may be substantially repelled and effectively removed from the structure 100, and the structure 102 may be formed. In the structure 102, unwanted electrical bridging and/or connection may be prevented, and desirable electrical insulation between metal gate electrodes 10 may be ensured. Advantageously, satisfactory semiconductor device quality (and performance) and a satisfactory manufacturing yield may be provided.

Figure 4:
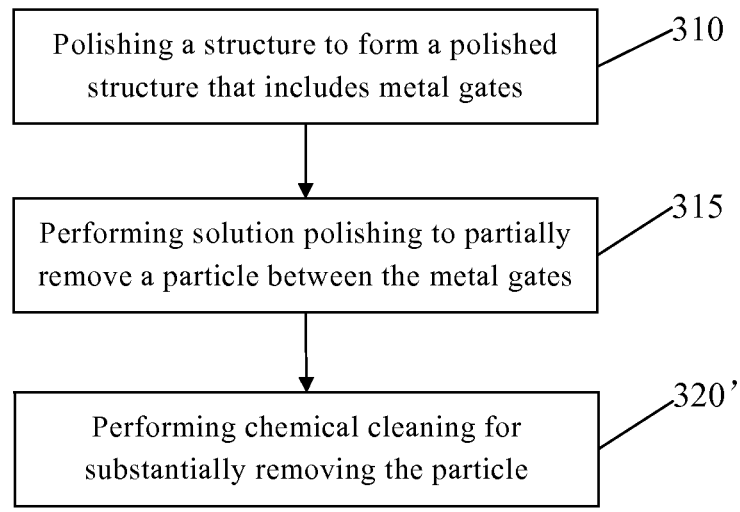
FIG. 4 shows a flowchart illustrating a method for processing a structure in of manufacturing a semiconductor device in accordance an embodiment of the present invention.

FIG. 4 shows a flowchart illustrating a method 400 for processing a structure (e.g., a semiconductor structure) in manufacturing of a semiconductor device in accordance an embodiment of the present invention. The method 400 may include a step 310, polishing a surface of the structure to produce a polished structure, such as the structure 100. The polished structure 100 may include metal gate electrodes 10, dielectric layer(s) 20, and dielectric layer(s) 30. As a result of the step 310, portions of metal gate electrodes 10 may protrude over one or more dielectric layers positioned between the metal gate electrodes 10, and an unwanted particle 25 may be positioned between protrusions of the metal gate electrodes 10 and may be positioned on the one or more dielectric layers.

In the method 400, subsequent to the step 310 and prior to a cleaning process, a solution polishing step 315 may be performed. The step 315 may include using a first organic acid to perform solution polishing on the structure 100, in order to remove at least a portion of the particle 25. The solution polishing step 315 may involve using a polishing pad that contacts the polished structure.

The method 400 may include selecting the first organic acid and/or determining the pH value of the first organic acid, such that the first organic acid may cause electrostatic repulsion between the surface of the polished structure 100 and the particle 25, for facilitating removal of the particle 25 from the polished structure 100. The method 300 may include select the first organic acid such that the first organic acid may not substantially or undesirably erode the structure 100 and/or the metal gate electrode 10. The first organic acid may be weakly acidic and may cause micro-chemical reactions. The pH value of the first organic acid may be in a range of 5 to 7 and may be in a range of 5.5 to 6.5. The weight percent (or mass percentage) of the first organic acid may be in a range of 0.01 wt % to 10 wt %. The first organic acid may include at least one of oxalic acid, malonic acid, succinic acid, maleic acid, phthalic acid, and an amino acid. As a result of the step 315, an intermediate structure (or further-polished structure) may be formed. The intermediate structure may include a remaining portion of the particle 25.

Subsequent to the step 315, a chemical cleaning step 320' may be performed. The step 320' may include using a second organic acid as a chemical cleaning agent to perform cleaning on the intermediate structure, in order to substantially remove the remaining portion of the particle 25. The chemical cleaning step 320' may not involve any pad that contacts the intermediate structure.

The method 400 may include selecting the second organic acid and/or determining the pH value of the second organic acid, such that the second organic acid may cause electrostatic repulsion between the surface of the intermediate structure and the remaining portion of the particle 25, for facilitating removal of the remaining portion of the particle 25 from the intermediate structure. The method 400 may include select the second organic acid such that the second organic acid may not substantially or undesirably erode the intermediate structure and/or the metal gate electrode 10. The second organic acid may be weakly acidic and may cause micro-chemical reactions. The pH value of the second organic acid may be in a range of 5 to 7 and may be in a range of 5.5 to 6.5. The weight percent (or mass percentage) of the second organic acid may be in a range of 0.01 wt % to 10 wt %. The second organic acid may include at least one of oxalic acid, malonic acid, succinic acid, maleic acid, phthalic acid, and an amino acid.

The step 315 and the step 320' performed after the step 315 may facilitate substantial and/or thorough removal of the particle 25. As a result of the step 320', the particle 25 may be substantially removed, and the structure 102 may be formed. In the structure 102, unwanted electrical bridging and/or connection may be prevented, and desirable electrical insulation between metal gate electrodes 10 may be ensured. Advantageously, satisfactory semiconductor device quality (and performance) and a satisfactory manufacturing yield may be provided.

Figure 5:
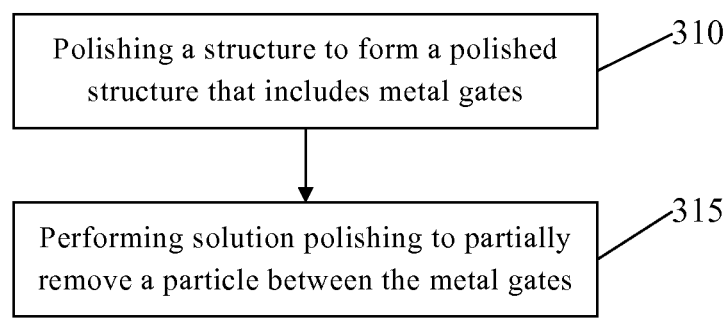
FIG. 5 shows a flowchart illustrating a method for processing a structure in manufacturing of a semiconductor device in accordance an embodiment of the present invention.

FIG. 5 shows a flowchart illustrating a method 500 for processing a structure (e.g., a semiconductor structure) in manufacturing of a semiconductor device in accordance an embodiment of the present invention. The method 500 may include the step 310, the step 315, and one or more features discussed with reference to the example of FIG. 4. In the method 500, as a result of the step 315, the particle 25 may have been partially, substantially, and/or completely removed, and an intermediate structure may be formed. The method 500 may further include, subsequent to the step 315, performing a conventional or well-known cleaning process on the intermediate structure, such that any remaining portion of the particle 25 may be substantially removed, and the structure 102 may be formed. In the structure 102, unwanted electrical bridging and/or connection may be prevented, and desirable electrical insulation between metal gate electrodes 10 may be ensured. Advantageously, satisfactory semiconductor device quality (and performance) and a satisfactory manufacturing yield may be provided.

An embodiment of the invention may include one or more of the steps 310, 315, 320, and 320 discussed with reference to the examples of FIGS. 3, 4, and 5 and/or may include one or more well-known steps. An embodiment of the invention may include one or more steps for forming various elements, features, and/or structures in the structure 102.

In an embodiment, one or more of the metal gates 10 may include or may be formed of one or more of tungsten (W), copper (Cu), aluminum (Al), ruthenium (Ru), platinum (Pt), and an alloy of some of these materials.

In an embodiment, the unwanted particle 25 may include or may be formed of one or more of $SiO_2$, $Al_2O_3$, $CeO_2$, a ceramic, a polymer, and a combination of some of these materials.

As can be appreciated from the foregoing, embodiments of the invention may enable substantially removal of unwanted electrical bridging and/or connections in semiconductor devices in the processes manufacturing the semiconductor devices. Advantageously, embodiments of the invention may contribute to satisfactory semiconductor device quality (and performance) and a satisfactory manufacturing yield.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for processing a structure in manufacturing of a semiconductor device, the method comprising:
    polishing the structure to form a polished structure, the polished structure comprising a first metal member, a dielectric layer that contacts the first metal member, and a particle that contacts at least one of the first metal member and the dielectric layer;
    applying a first organic acid to the polished structure to remove at least a first portion of the particle, and
    applying a second organic acid to remove a second portion of the particle,
    wherein the first organic acid is applied in a solution polishing process to remove the first portion of the particle, wherein the second organic acid is used in a chemical cleaning process to remove the second portion of the particle, and wherein the chemical cleaning process is performed after the solution polishing process.

2. The method of claim 1, wherein the first metal member is a tungsten gate electrode of a transistor.

3. The method of claim 1, wherein the dielectric layer includes at least one of a SiO.sub.2 layer and a SiN layer.

4. A method for processing a structure in manufacturing of a semiconductor device, the method comprising:
    polishing the structure to form a polished structure, the polished structure comprising a first metal member, a dielectric layer that contacts the first metal member, and a particle that contacts at least one of the first metal member and the dielectric layer; and
    applying a first organic acid to the polished structure to remove at least a first portion of the particle,
    wherein the polished structure further comprises a second metal member, and wherein the dielectric layer contacts the particle and is positioned between the first metal member and the second metal member.

5. The method of claim 4, wherein a protrusion of the first metal member protrudes over the dielectric layer, wherein a protrusion of the second metal member protrudes over the dielectric layer, and wherein the particle is located between the protrusion of the first metal member and the protrusion of the second metal member.

6. The method of claim 4, further comprising: using the first organic acid to cause at least one of first electrostatic repulsion between the particle and the dielectric layer, second electrostatic repulsion between the particle and the first metal member, and third electrostatic repulsion between the particle and the second metal member.

7. The method of claim 4, further comprising: using the first organic acid to cause the particle to have a first negative Zeta potential value; and using the first organic acid to cause at least one of the first metal member and the second metal member to have a second negative Zeta potential value.

8. The method of claim 7, further comprising: using the first organic acid to cause the dielectric layer to have a third negative Zeta potential value.

9. The method of claim 1, further comprising: using the first organic acid to cause electrostatic repulsion between the particle and the first metal member.

10. The method of claim 1, wherein a pH value of the first organic acid is in a range of 5 to 7.

11. The method of claim 1, wherein a pH value of the first organic acid is in a range of 5.5 to 6.5.

12. The method of claim 1, wherein the first organic acid includes at least one of oxalic acid, malonic acid, succinic acid, maleic acid, phthalic acid, and an amino acid.

13. The method of claim 1, wherein a weight percent of the first organic acid is in a range of 0.01 wt % to 10 wt %.

14. The method of claim 1, wherein the first organic acid is applied in a chemical cleaning process to substantially remove the particle.

15. The method of claim 1, wherein a pH value of the second organic acid is in a range of 5 to 7.

16. The method of claim 1, wherein the second organic acid includes at least one of oxalic acid, malonic acid, succinic acid, maleic acid, phthalic acid, and an amino acid.

17. The method of claim 1, wherein a weight percent of the second organic acid is in a range of 0.01 wt % to 10 wt %.

18. A method for manufacturing a semiconductor device, the method comprising:
    forming a structure that comprises a semiconductor member;
    polishing the structure to form a polished structure, the polished structure comprising the semiconductor member, a metal member, a dielectric layer that contacts the metal member, and a particle that contacts at least one of the metal member and the dielectric layer;
    applying a first organic acid to the polished structure to remove at least a first portion of the particle, wherein the first organic acid causes first electrostatic repulsion between the particle and at least one of the metal member and the dielectric layer, and
    applying a second organic acid to remove a second portion of the particle,
    wherein the second organic acid causes second electrostatic repulsion between the second portion of the particle and at least one of the metal member and the dielectric layer.

* * * * *